(12) United States Patent
Oh et al.

(10) Patent No.: US 9,972,807 B2
(45) Date of Patent: May 15, 2018

(54) DISPLAY APPARATUS INCLUDING ENCAPSULATION FILM AND METHOD OF INSPECTING THE ENCAPSULATION FILM

(71) Applicants: Samsung Display Co., Ltd., Yongin (KR); Seoul National University R&DB Foundation, Seoul (KR)

(72) Inventors: Min-Ho Oh, Yongin (KR); Yoon-Hyeung Cho, Yongin (KR); Yong-Tak Kim, Yongin (KR); So-Young Lee, Yongin (KR); Jong-Woo Kim, Yongin (KR); Ji-Young Moon, Yongin (KR); Hyeong-Joon Kim, Seoul (KR); Sang-Hyun Park, Seoul (KR); Hyuk-Jin Kim, Seoul (KR); Seung-Ha Oh, Seoul (KR)

(73) Assignees: Samsung Display Co., Ltd., Yongin (KR); Seoul National University R&DB Foundation, Seoul (KR)

( * ) Notice: Subject to any disclaimer, the term of this patent is extended or adjusted under 35 U.S.C. 154(b) by 373 days.

(21) Appl. No.: 14/204,608

(22) Filed: Mar. 11, 2014

(65) Prior Publication Data

US 2015/0042346 A1 Feb. 12, 2015

(30) Foreign Application Priority Data

Aug. 8, 2013 (KR) ........................ 10-2013-0094337

(51) Int. Cl.
*H01L 51/52* (2006.01)
*G01N 27/00* (2006.01)
*H01L 27/32* (2006.01)
*H01L 51/00* (2006.01)

(52) U.S. Cl.
CPC ...... *H01L 51/5256* (2013.01); *H01L 51/0031* (2013.01)

(58) Field of Classification Search
None
See application file for complete search history.

(56) References Cited

U.S. PATENT DOCUMENTS

| | | | |
|---|---|---|---|
| 6,570,325 B2 * | 5/2003 | Graff | H01L 51/5256 313/502 |
| 8,059,008 B2 | 11/2011 | Marincak | |
| 2007/0296674 A1 | 12/2007 | Aoki et al. | |

(Continued)

FOREIGN PATENT DOCUMENTS

| KR | 10-2007-0121527 | 12/2007 |
|---|---|---|
| KR | 10-2009-0011228 | 2/2009 |
| KR | 10-2011-0065854 | 6/2011 |

OTHER PUBLICATIONS

Grego et al., "A method to evaluate mechanical performance of thin transparent films for flexible displays", Thin Solid Films, Apr. 9, 2007, pp. 4745-4752, vol. 515, Issue 11, RTI International, Research Triangle Park, NC, USA.

*Primary Examiner* — Robert Carpenter
(74) *Attorney, Agent, or Firm* — H.C. Park & Associates, PLC

(57) ABSTRACT

A display apparatus is provided. The display apparatus includes a substrate, a display panel on the substrate, and an encapsulation film sealing the display panel. The encapsulation film includes at least one organic layer and/or at least one inorganic layer and at least one pair of conductive layers.

11 Claims, 5 Drawing Sheets

(56) References Cited

U.S. PATENT DOCUMENTS

| | | | |
|---|---|---|---|
| 2008/0237872 A1* | 10/2008 | Nagayama | H01L 22/34 257/773 |
| 2009/0029491 A1 | 1/2009 | Lee | |
| 2011/0097533 A1 | 4/2011 | Li et al. | |
| 2011/0140163 A1 | 6/2011 | Oh et al. | |
| 2014/0320136 A1* | 10/2014 | Cho | G09G 3/006 324/414 |
| 2015/0303336 A1* | 10/2015 | Lefebvre | H01L 31/048 136/259 |

* cited by examiner

DISPLAY APPARATUS INCLUDING ENCAPSULATION FILM AND METHOD OF INSPECTING THE ENCAPSULATION FILM

CROSS REFERENCE TO RELATED APPLICATION

This application claims the benefit of Korean Patent Application No. 10-2013-0094337, filed on Aug. 8, 2013, in the Korean Intellectual Property Office, which is hereby incorporated by reference for all purposes as if fully set forth herein.

BACKGROUND

Field

Exemplary embodiments of the present invention relate to display apparatuses including an encapsulation film and methods of inspecting the encapsulation film. More particularly, these embodiments relate to display apparatuses configured to inspect and evaluate the characteristics of an encapsulation film sealing a display device.

Discussion of the Background

With the recent developments in the field of semiconductor technology, the screen size of flat panel display apparatuses has increased while the weight of these display apparatuses has decreased. Due to these improved characteristics of display apparatuses, demand has increased for further advancements in flat panel display apparatuses. Examples of such flat panel display apparatuses include liquid crystal displays (LCDs), plasma display devices (PDPs), field emission display devices (FEDs), electroluminescence display devices (ELDs), electrophoresis display devices (EPDs), and organic light-emitting display (OLED) apparatuses.

Since flat panel display apparatuses are lighter and slimmer than cathode ray tube displays, use of large flat panel display apparatuses is increasing. Additionally, new flexible display apparatuses are emerging as flat panel display apparatuses. Since flexible display apparatuses use a substrate formed of a flexible material, they may maintain a display performance even when bent, folded, rolled, or otherwise stressed.

Flat panel display apparatuses may be provided with an encapsulation film that seals a display device to prevent external oxygen or moisture from penetrating into the display device, and this structure may also be applied to flexible, rollable, or foldable display apparatuses.

BRIEF SUMMARY

Exemplary embodiments of the present invention provide display apparatuses including an encapsulation film that may have improved reliability. The improved reliability of the encapsulation film may be achieved by configuring the encapsulation film to allow for the evaluation of certain characteristics of the encapsulation film.

Additional aspects will be set forth in part in the description which follows and, in part, will be apparent from the description, or may be learned by practice of the presented embodiments.

According to one or more embodiments of the present invention, a display apparatus includes: a substrate; a display panel disposed on the substrate; and an encapsulation film sealing the display panel, wherein the encapsulation film includes at least one of an organic layer and an inorganic layer, and at least one pair of conductive layers comprising a first conductive layer and a second conductive layer.

According to one or more embodiments of the present invention, a display apparatus may include: a substrate; a display panel disposed on the substrate; an upper encapsulation film sealing the display panel; and lower encapsulation film disposed on a second side of the substrate, the second side of the substrate being opposite to the first side of the substrate, and wherein the lower encapsulation film comprises at least one of a lower organic layer and a lower inorganic layer and at least one pair of lower conductive layers comprising a first lower conductive layer and a second lower conductive layer.

According to one or more embodiments of the present invention, a method of inspecting an encapsulation film includes: preparing a display apparatus including an encapsulation film including a first conductive layer and a second conductive layer that are spaced apart from each other; applying a first electrical signal to the first conductive layer or the second conductive layer; and measuring a second electrical signal that is generated by the first conductive layer and the second conductive layer when applying the first electrical signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
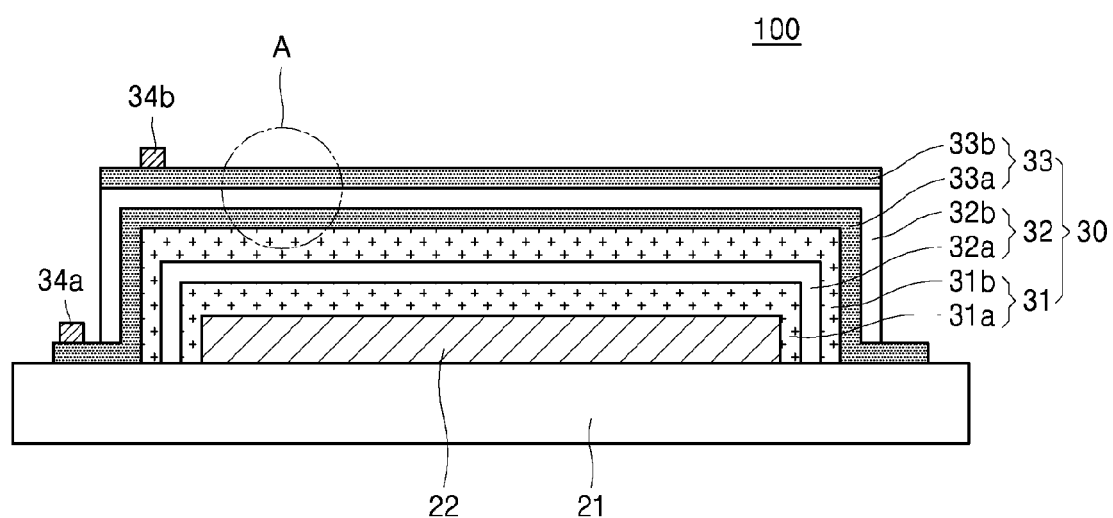
FIG. 1 is a schematic cross-sectional view illustrating a structure of a display apparatus according to an embodiment of the present invention.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present invention will be described in detail with reference to the accompanying drawings. Like reference numerals in the drawings denote like elements, and thus their description will be omitted. In the drawings, the sizes of elements may be exaggerated for clarity and convenience of description.

The embodiments described hereinafter are merely exemplary, and various changes and modifications may be made therein. For example, when a layer is referred to as being "on" another layer or substrate, it may be directly on the other layer or substrate, or intervening layers may also be present.

The terminology used herein is for the purpose of describing the embodiments only and is not intended to be limiting of the embodiments. As used herein, the singular forms "a," "an" and "the" are intended to include the plural forms as well, unless the context clearly indicates otherwise. It will be further understood that the terms "comprises" and/or "comprising" used herein specify the presence of stated elements, steps, operations, or devices, but do not preclude the presence or addition of one or more other elements, steps, operations, or devices. Although terms such as "first" and "second" may be used herein to describe various elements or components, these elements or components should not be limited by these terms. These terms are only used to distinguish one element or component from another element or component.

When a certain embodiment may be implemented differently, a specific process order may be performed differently from the described order. For example, two consecutively described processes may be performed substantially at the same time or performed in an order opposite to the described order.

FIG. 1 is a schematic cross-sectional view illustrating a structure of a display apparatus 100 according to an exemplary embodiment of the present invention. Referring to FIG. 1, the display apparatus 100 includes a substrate 21, a display panel 22 on the substrate 21, and an encapsulation film 30 sealing the display panel 22.

The encapsulation film 30 prevents external moisture or gasses from penetrating into the display panel 22. The encapsulation film 30 includes at least one organic layer 31 and/or at least one inorganic layer 32 and at least one pair of conductive layers 33. The at least one pair of conductive layers 33 may include a first conductive layer 33a and a second conductive layer 33b. The first conductive layer 33a and the second conductive layer 33b may be spaced apart by at least one organic layer 31 and/or at least one inorganic layer 32.

According to embodiments of the present invention, the pair of conductive layers 33 may be provided to evaluate characteristics of the organic layer 31 and/or the inorganic layer 32 included in the encapsulation film 30. The organic layer 31 and/or the inorganic layer 32 included in the encapsulation film 30 may have a foreign substance or may develop cracks due to, for example, process conditions or use environments. Also, physical characteristics thereof, for example, a dielectric constant and a resistance, may change due to the penetration of moisture into the organic layer 31 and/or the inorganic layer 32. Thus, the pair of conductive layers 33 may be provided to evaluate or inspect a crack and/or other physical characteristic change that may occur in the organic layer 31 and/or the inorganic layer 32 of the encapsulation film 30.

The encapsulation film 30 may be inspected in the following way. First, a display apparatus 100 including an encapsulation film 30, that in turn includes a pair of conductive layers 33. The pair of conductive layers 33, which may include a first conductive layer 33a and a second conductive layer 33b that are spaced apart by an organic layer 31 and/or an inorganic layer 32, is prepared.

Thereafter, a first electrical signal is applied between the first conductive layer 33a and the second conductive layer 33b. The first electrical signal may be any electrical signal, such as a direct current (DC) voltage, an alternating current (AC) voltage, or a current, that may be used to evaluate certain physical characteristics of the organic layer 31 and/or the inorganic layer 32 provided between the first conductive layer 33a and the second conductive layer 33b.

Thereafter, a second electrical signal, which is generated between the first conductive layer 33a and the second conductive layer 33b by applying the first electrical signal, is measured. The second electrical signal may be, but is not limited to, a current, a resistance, a capacitance, or an inductance. In some embodiments, when the first electrical signal is a DC voltage, the second electrical signal may be a leakage current. In other embodiments, when the first electrical signal is an AC voltage, the second electrical signal may be a capacitance. Additionally, the second electrical signal may be measured depending on an AC frequency of the first electrical signal.

A defect or a status change in the encapsulation film 30 may be detected based on a reference value compared to the second electrical signal, and also depending on the first electrical signal. For example, in a case where the second electrical signal is a leakage current, if the second electrical signal is greater than a predetermined reference value $I_0$, the encapsulation film 30 may be evaluated as defective.

Figure 2A:
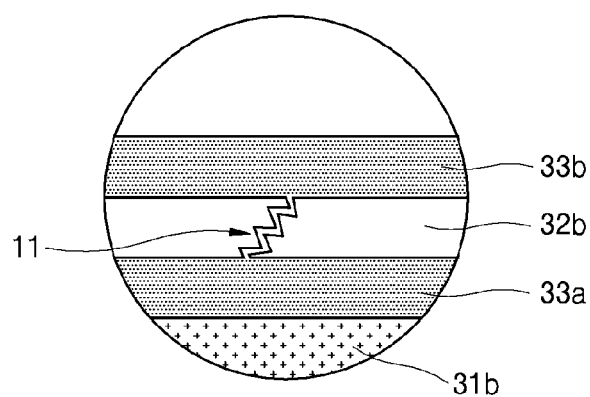
FIG. 2A is an enlarged cross-sectional view of region A in FIG. 1.
Figure 2B:
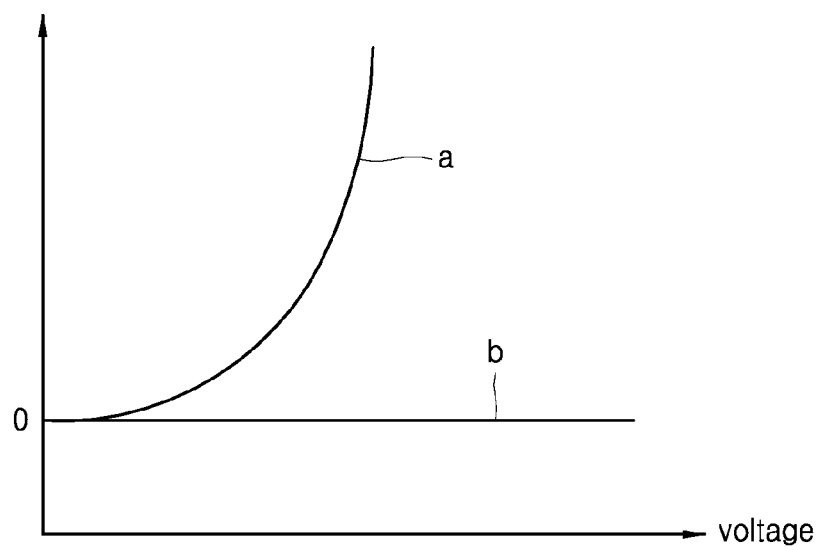
FIG. 2B is a graph depicting two evaluations of the characteristics of an encapsulation film.

FIGS. 2A and 2B are diagrams illustrating an exemplary embodiment of the inventive device evaluating characteristics of the encapsulation film 30. FIG. 2A is an enlarged cross-sectional view of region A in FIG. 1, and FIG. 2B is a graph illustrating an embodiment of evaluating the characteristics of the encapsulation film 30.

Referring to FIG. 2A, the encapsulation film 30 includes second inorganic layer 32b disposed between the first conductive layer 33a and the second conductive layer 33b. Although the structure is illustrated as including only one second inorganic layer 32b, embodiments of the present invention are not limited thereto. For example, an additional organic or inorganic layer may be provided on and/or under the second inorganic layer 32b. Also, a plurality of additional organic or inorganic layers may be provided on and/or under the second inorganic layer 32b. In this embodiment, a leakage current depending on a DC current may be measured. However, as noted above, various electrical signals may be measured.

Referring to FIG. 2B, when there is no crack 11 in the second inorganic layer 32b (graph line b), a leakage current is not generated when a voltage is applied. On the other hand, when there is a crack 11 in the second inorganic layer 32b (graph line a), a leakage current may increase rapidly in accordance with an increase in voltage. The tendency of a leakage current may depend on the size of the crack. In this case, an applied voltage may be about 0 V to about 1,000 V.

When there is no crack 11 in second inorganic layer 32b, the first conductive layer 33a and the second conductive layer 33b may be electrically isolated from each other or may be weakly electrically connected to each other by the second inorganic layer 32b. However, when there is a crack 11 in the second inorganic layer 32b, as shown in FIG. 2A, a current may flow between the first conductive layer 33a and the second conductive layer 33b through the crack 11. Thus, a leakage current may increase rapidly with an increase in voltage, as shown by line (a) in FIG. 2B. In this manner, the characteristics of the encapsulation film 30 may be evaluated or inspected based on a leakage current that, in turn, depends on an applied voltage.

The above method of inspecting the encapsulation film 30 is merely an exemplary embodiment, and various modifications may be made therein. For example, the encapsulation film 30 may be inspected by applying an AC voltage between the first conductive layer 33a and the second conductive layer 33b, measuring an impedance (i.e., a resistance) or a capacitance, and evaluating a change in the values thereof.

A detailed configuration of the display apparatus 100 will now be described with reference to FIG. 1. The substrate 21 may be a transparent glass substrate formed mainly of $SiO_2$. However, the substrate 21 is not limited thereto, and may be formed of various materials, such as ceramics, plastics, or metals. Additionally, the substrate 21 may be flexible substrate. In an exemplary embodiment, the substrate 21 may be a fiber reinforced plastic (FRP) substrate. In another exemplary embodiment, the substrate 21 may include a fiber tissue and/or a polymer resin. The fiber tissue may include, for example, an optical fiber, a cotton yarn based on an optical fiber, a textile, or any combination thereof. The polymer resin may include, for example, an epoxy resin or an acryl resin.

The display panel 22 is a panel displaying, for example, characters, figures, or images, and may include a plurality of display devices and/or a driving device for driving the display devices. Examples of the display devices include liquid crystal display (LCD) devices, organic light-emitting display (OLED) devices, plasma display devices, and electrophoresis display devices.

In some embodiments, each of the display devices may include: signal lines, such as a gate line transmitting a gate signal and a data line transmitting a data signal; a switching device connected to the gate line and the data line; and a pixel electrode connected to the switching device to receive an applied data signal. Also, each of the display devices may constitute a pixel area.

The encapsulation film 30 prevents external moisture or air (e.g., oxygen) from penetrating into the display panel 22. The encapsulation film 30 may be formed to cover the top surface and the side surfaces of the display panel 22. The encapsulation film 30 includes at least one organic layer 31 and/or at least one inorganic layer 32 and at least one pair of conductive layers 33.

The at least one organic layer 31 is illustrated in FIG. 1 as including a first organic layer 31a and a second organic layer 31b. However, the at least one organic layer 31 may include only one of the first organic layer 31a and the second organic layer 31b, but may include one or more additional organic layers. The organic layer 31 may provide planarization and/or a stress control.

For example, the organic layer 31 may be formed of a polymer, and may be a stacked film or a single film formed of any one of polyethylene terephthalate, polyimide, polycarbonate, epoxy, polyethylene, and polyacrylate. The organic layer 31 may be alternatively or additionally formed of polyacrylate, and may include a polymer of a monomer composition including a diacrylate monomer and a polyacrylate monomer. The monomer composition may include a monoacrylate monomer. Also, the organic layer 31 may include a photo-initiator such as TPO (2,4,6-Trimethylbenzoyl-diphenyl-phosphineoxide).

The inorganic layer 32 is illustrated as including a first inorganic layer 32a and a second inorganic layer 31b. However, the inorganic layer 32 may include only one of the first inorganic layer 32a and the second inorganic layer 31b, or may include an additional inorganic layer or layers. The inorganic 32 may have a higher film density than the organic layer 31, and thus, may have a higher barrier function for blocking external air.

The inorganic layer 32 may be a stacked film or a single film including a metal oxide or a metal nitride. Particularly, the inorganic layer 32 may include at least one of $SiN_x$, $Al_2O_3$, $SiO_2$, $TiO_2$, SiON, AZO, ZnO, and ZrO. However, this is merely exemplary, and embodiments of the present invention are not limited thereto.

The inorganic layer 32 may have a film structure including low melting glass such as a tin oxide (SnO). However, this is merely exemplary, and embodiments of the present invention are not limited thereto. The organic layer 31 and the inorganic layer 32 may additionally or alternatively be formed of an insulating material.

The encapsulation film 30 may include a pair of conductive layers 33, including a first conductive layer 33a and a second conductive layer 33b. The organic layer 31 and/or the inorganic layer 32 may be disposed between the first conductive layer 33a and the second conductive layer 33b. The pair of conductive layers 33 are used to measure characteristics of the organic layer 31 and/or the inorganic layer 32 provided therebetween, and may additionally operate as an electrode. The conductive layers 33 may be configured to apply an external electrical signal.

The first conductive layer 33a may cover the organic layer 31 and/or the inorganic layer 32. An end of the conductive layer 33a may further extend to the outside to apply or measure an electrical signal. An additional contact electrode 34a may be formed at the end of the first conductive layer 33a.

When the second conductive layer 33b is formed at the uppermost layer of the encapsulation film 30, an electrical signal may be applied to the top surface or the side surfaces of the second conductive layer 33b, and/or an electrical signal may be measured. An additional contact electrode 34b may be formed at the top surface or the side surfaces of the second conductive layer 33b.

The conductive layer 33 may include a metal or a transparent conductive metal oxide. When the display apparatus 100 is a front emission type, the conductive layer 33 may be configured to transmit light. Thus, in some embodiments, the conductive layer 33 may include at least one of an indium tin oxide (ITO), an indium zinc oxide (IZO), an aluminum zinc oxide (AZO), a fluorine tin oxide (FTO), ZnO, GZO (ZnO:Ga), IGZO, InOx, and $In2O_3$. In some embodiments, the conductive layer 33 may include a conductive material including at least one of Ag, Mg, Al, Pt, Pd, Au, Ni, Nd, Ir, Cr, Li, Yb, and Ca. The conductive layer 33 may be formed of a single layer or a plurality of layers.

The first conductive layer 33a and the second conductive layer 33b may be provided on the bottom surface and the top surface of the second inorganic layer 32b, respectively. In this case, the second inorganic layer 32b may be the uppermost layer of the encapsulation film 30. Since the inorganic layer 32 has lower flexibility than the organic layer 31, it may crack or peel off when exposed to an external stress.

Additionally, the second inorganic layer 32b may have a greater bending curvature than the first inorganic layer 32a. Therefore, a characteristic change and/or a defect degree of the entire encapsulation film 30 may be estimated by measuring a physical characteristic changes and/or cracks of the inorganic layer 32b. However, this configuration is only exemplary the positions of the first conductive layer 33a and the second conductive layer 33b are not limited thereto.

One of a pair of conductive layers 33 may be disposed on organic layer 31 and the other of a pair of conductive layers 33 may be disposed under the organic layer 31. For example, the first conductive layer 33a and the second conductive layer 33b may also be provided on the bottom surface and the top surface of the first organic layer 31a respectively. In this case, the first conductive layer 33a and the second conductive layer 33b may be configured to measure the characteristics of the first organic layer 31a. Also, the conductive layer 33 may be provided in a plurality of pairs.

Although the encapsulation film 30 is illustrated as including a structure in which the first organic layer 31a, the first inorganic layer 32a, the second organic layer 31b, the first conductive layer 33a, the second inorganic layer 32b, and the second conductive layer 3b are sequentially stacked on the display panel 22, the stack structure is not limited thereto. For example, the encapsulation film 30 may include a structure in which a plurality of organic layers 31 are sequentially stacked, and/or a structure in which a plurality of inorganic layers 32 are sequentially stacked. Also, the encapsulation film 30 may include a structure in which a plurality of organic layers 31 and/or a plurality of inorganic layers 32 are stacked between a pair of conductive layers 33.

The first organic layer 31a may have a smaller area than the first inorganic layer 32a, and the first organic layer 31a may be completely covered by the first inorganic layer 32a. Alternatively, the first inorganic layer 32a may have a smaller area than the second organic layer 31b, and the first inorganic layer 32a may be completely covered by the second organic layer 31b.

A halogenated metal layer (not illustrated) including LiF may be further provided between the display panel 22 and the encapsulation film 30. The halogenated metal layer may prevent the display panel 22 from being damaged when the encapsulation film 30 is formed by sputtering or plasma deposition.

Also, members for reducing external light reflection, or members for increasing a color resolution, such as a polarization film (not illustrated), a phase difference film (not illustrated), and a filter (not illustrated), may be further provided on the top surface of the encapsulation film 30.

Figure 3A:
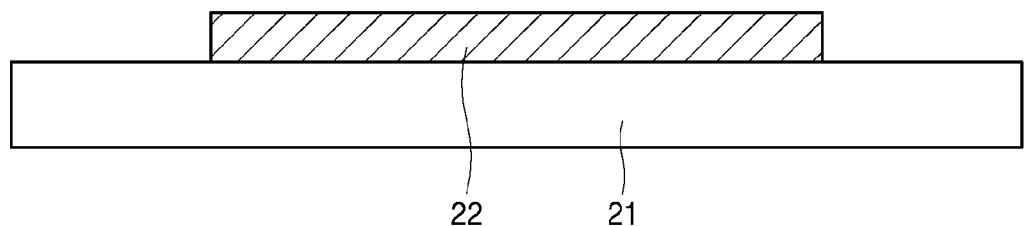
FIGS. 3A to 3D are sequential cross-sectional views illustrating an embodiment of a method of manufacturing a display apparatus according to an embodiment of the present invention.
Figure 3B:
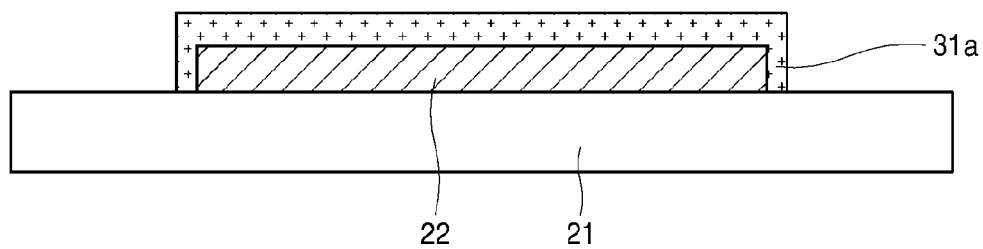

FIGS. 3A to 3D are sequential cross-sectional views illustrating an embodiment of a method of manufacturing the display apparatus 100, according to an embodiment of the present invention. Referring to FIG. 3A, a display panel 22 is formed on a substrate 21. The display panel 22 may include a plurality of display devices and a driving device, and may be formed in various methods depending on the type of the display devices and the driving device. Referring to FIG. 3B, a first organic layer 31a is formed on the display panel 22. The first organic layer 31a may be formed to completely cover the display panel 22.

The first organic layer 31a may be formed of a polymer, and may be a single layer or a plurality of layers formed of any one of polyethylene terephthalate, polyimide, polycarbonate, epoxy, polyethylene, and polyacrylate. In some embodiments, the first organic layer 31a may be formed of polyacrylate, and may include a polymer of a monomer composition including a diacrylate monomer and a polyacrylate monomer. The monomer composition may further include a monoacrylate monomer. Also, the first organic layer 31a may further include a photo-initiator such as TPO (2,4,6-Trimethylbenzoyl-diphenyl-phosphineoxide).

The first organic layer 31a may be applied as a coating or otherwise deposited by, for example, flash evaporation, ink-jet printing, or slot die coating. In some embodiments, the first organic layer 31a may be hardened by heat and/or light. For example, the first organic layer 31a may be formed by depositing a liquid monomer and polymerizing the same by radiating ultraviolet light thereon.

Figure 3C:
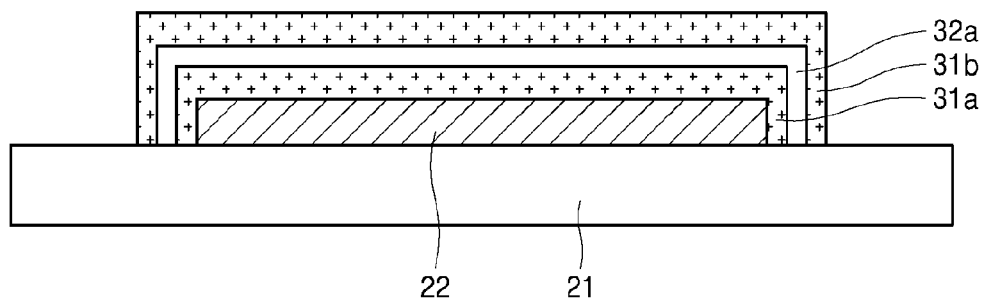

Referring to FIG. 3C, a first inorganic layer 32a and a second organic layer 31b are sequentially formed on the first organic layer 31a. The first inorganic layer 32a may be formed to completely cover the first organic layer 31a. The first inorganic layer 32a may be a single layer or a plurality of layers including a metal oxide or a metal nitride. In particular, the first inorganic layer 32a may include at least one of $SiN_x$, $Al_2O_3$, $SiO_2$, $TiO_2$, SiON, and ZrO. The first inorganic layer 32a may have a film structure that may include low melting glass such as a tin oxide (SnO). The first inorganic layer 32a may be deposited by various deposition methods, such as chemical vapor deposition (CVD), atomic layer deposition (ALD), and sputtering.

The second organic layer 31b may be deposited to completely cover the first inorganic layer 32a. The second organic layer 31b may be formed of a polymer, and may be a single layer or a plurality of layers formed of any one of polyethylene terephthalate, polyimide, polycarbonate, epoxy, polyethylene, and polyacrylate. In some embodiments, the second organic layer 31b may be formed of polyacrylate, and may include a polymer of a monomer composition including a diacrylate monomer and a polyacrylate monomer. The monomer composition may further include a monoacrylate monomer. Also, the second organic layer 31b may further include a photo-initiator such as TPO (2,4,6-Trimethylbenzoyl-diphenyl-phosphineoxide).

The second organic layer 31b may be applied as a coating or deposited by, for example, flash evaporation, ink-jet printing, or slot die coating.

The second organic layer 31b may be formed of the same material and by the same deposition method, as the first organic layer 31a. However, embodiments of the present invention are not limited thereto. For example, the first organic layer 31a may not include a photo-initiator, and the second organic layer 31b may include a photo-initiator.

Figure 3D:
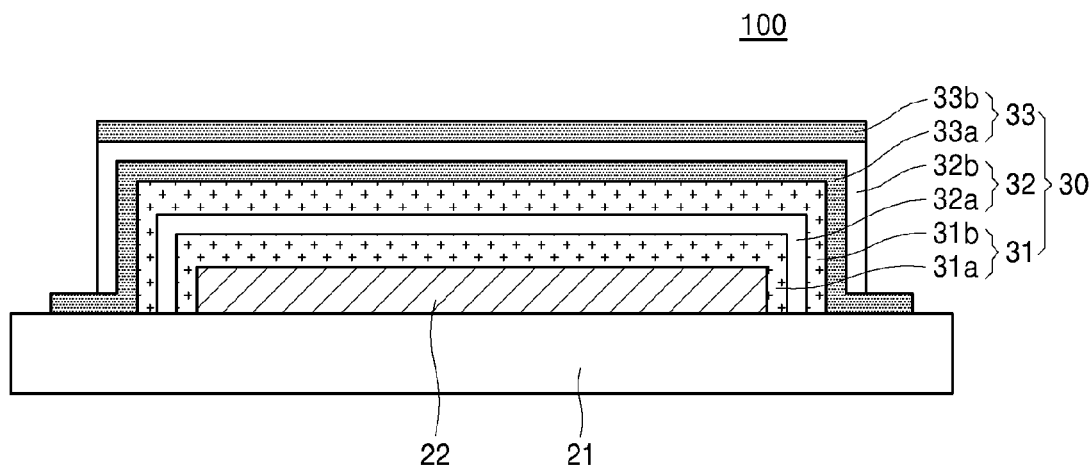

Referring to FIG. 3D, a first conductive layer 33a, a second inorganic layer 32b, and a second conductive layer 33b are sequentially stacked on the second organic layer 31b. The first conductive layer 33a and/or the second conductive layer 33b may be formed of various conductive materials. For example, the first conductive layer 33a and the second conductive layer 33b may include a metal or a transparent conductive (metal) oxide (TCO). In some embodiments, the first and second conductive layers 33a and 33b may include a conductive material including at least one of Ag, Mg, Al, Pt, Pd, Au, Ni, Nd, Ir, Cr, Li, Yb, and Ca. In some embodiments, the first second conductive layer 33a and/or the second conductive layer 33b may include at least one of an indium tin oxide (ITO), an indium zinc oxide (IZO), an aluminum zinc oxide (AZO), a fluorine tin oxide (FTO), ZnO, GZO (ZnO:Ga), IGZO, InOx, and $In2O_3$.

The first conductive layer 33a and/or the second conductive layer 33b may be formed by various deposition methods. For example, the first conductive layer 33a and/or the second conductive layer 33b may be deposited by sputtering, pulsed laser deposition (PLD), chemical vapor deposition (CVD), metal organic chemical vapor deposition (MOCVD), solution deposition, or other methods. The first conductive layer 33a and the second conductive layer 33b may be formed of the same material by the same deposition method; however, embodiments of the present invention are not limited thereto.

The first conductive layer 33a may be formed to completely cover the second organic layer 31b. The first conductive layer 33a may be formed such that a portion thereof is exposed to the outside. An electrical signal may be applied to the first conductive layer 33a. Alternatively, an electrical signal may be output from the first conductive layer 33a.

The second inorganic layer 32b may be formed between the first conductive layer 33a and the second conductive layer 33b. The second inorganic layer 32b may be a single layer or a plurality of layers including a metal oxide or a metal nitride. The second inorganic layer 32b may include at least one of $SiN_x$, $Al_2O_3$, $SiO_2$, $TiO_2$, SiON, and ZrO. The second inorganic layer 32b may have a film structure including low melting glass such as a tin oxide (SnO). The second inorganic layer 32b may be deposited by various deposition methods, such as chemical vapor deposition (CVD), atomic layer deposition (ALD), or sputtering.

Although not illustrated, the first conductive layer 33a and/or the second conductive layer 33b may be provided with an electrode (not illustrated) that may be connected to an external electrical signal input/output device (not illustrated).

Figure 4:
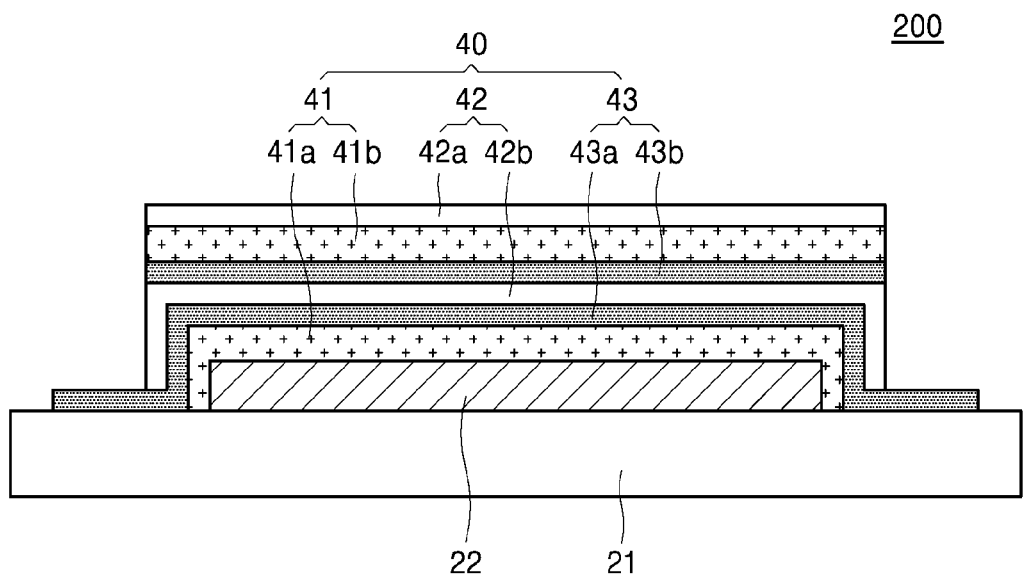
FIG. 4 is a schematic cross-sectional view illustrating a structure of a display apparatus according to another embodiment of the present invention.

FIG. 4 is a schematic cross-sectional view illustrating a structure of a display apparatus 200 according to another embodiment of the present invention. In FIG. 4, like reference numerals as in FIG. 1 denote like elements. Thus, a description thereof will be omitted herein for simplicity of description.

Referring to FIG. 4, an encapsulation film 40 has a structure in which a first organic layer 41a, a first conductive layer 43a, a first inorganic layer 42a, a second conductive layer 43b, a second organic layer 41b, and a second inorganic layer 42b are sequentially stacked on a display panel 22.

The encapsulation film 40 of FIG. 4 is different from the encapsulation film 30 of FIG. 3 in that the first conductive layer 43a and the second conductive layer 43b are disposed on the bottom surface and the top surface of the first inorganic layer 42b, respectively. By this structure, the first conductive layer 43a and the second conductive layer 43b may operate as electrodes that may measure characteristics of the second inorganic layer 42b. The second organic layer 41b and the first inorganic layer 42a disposed on the second conductive layer 43b may be formed such that a portion (e.g., side surfaces) of the second conductive layer 43b may be exposed to the outside.

The first organic layer 41a and the second organic layer 41b may be formed of the same material as the first organic layer 31 of FIG. 1. The first inorganic layer 42a and the second inorganic layer 42b may be formed of the same material as the inorganic layer 32 of FIG. 1. The first conductive layer 43a and the second conductive layer 43b may be formed of the same material as the conductive layer 33 of FIG. 1.

Figure 5:
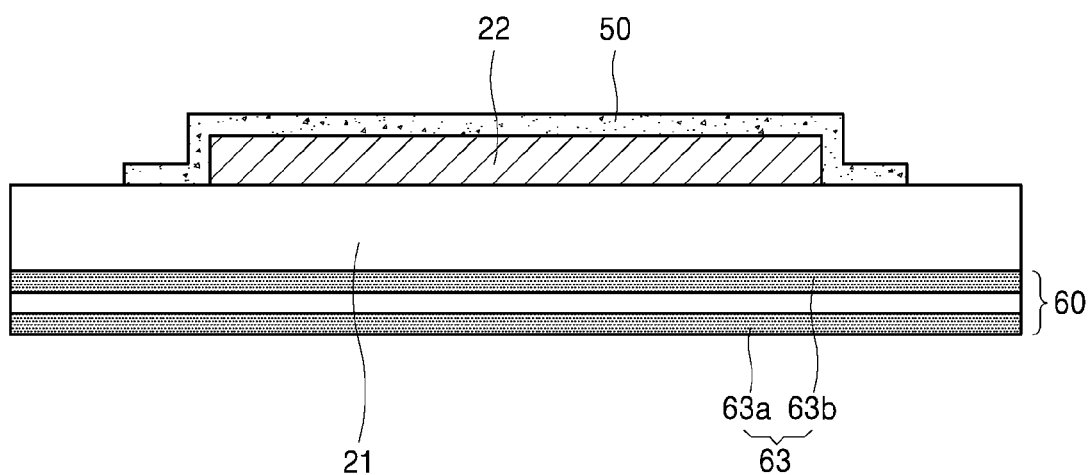
FIG. 5 is a schematic cross-sectional view illustrating a structure of a display apparatus according to another embodiment of the present invention.

FIG. 5 is a schematic cross-sectional view illustrating a structure of a display apparatus 300 according to another embodiment of the present invention. In FIG. 5, like reference numerals as in FIG. 1 denote like elements. Thus, a detailed description thereof will be omitted herein for simplicity of description.

Referring to FIG. 5, the display apparatus 300 includes a substrate 21, a display panel 22, an upper encapsulation film 50 sealing the display panel 22, and a lower encapsulation film 60 sealing the bottom of the substrate 21. The lower encapsulation film 60 includes at least one lower organic layer and/or at least one lower inorganic layer and at least one pair of lower conductive layers.

The display apparatus 300 of FIG. 5 is different from the display apparatus 100 of FIG. 1, in that the lower encapsulation film 60 is disposed under the substrate 21. The lower encapsulation film 60 may prevent external moisture or oxygen from penetrating into the display panel 22 through the substrate 21. The lower encapsulation film 60 includes at least one lower organic layer (not illustrated) and/or at least one lower inorganic layer (not illustrated). Also, the lower encapsulation film 60 includes at least one pair of lower conductive layers 63a and 63b.

The lower encapsulation film 60 may include an organic layer or an inorganic layer, and may include a combination of an organic layer and an inorganic layer. The organic layer and the inorganic layer of the lower encapsulation film 60 may be formed of the same material as the organic layer 31 and the inorganic layer 32 of FIG. 1.

A lower conductive layer 63 may include a first lower conductive layer 63a and a second lower conductive layer 63b, which may be formed of various conductive materials. The first lower conductive layer 63a and the second lower conductive layer 63b may be disposed on the bottom surface and the top surface of the lower encapsulation film 60, respectively. Thus, the first lower conductive layer 63a and the second lower conductive layer 63b may operate as electrodes that may measure characteristics of the lower encapsulation film 60.

Although the first lower conductive layer 63a and the second lower conductive layer 63b are illustrated as being disposed on the top surface and the bottom surface of the lower encapsulation film 60, embodiments are not limited to this configuration since various modifications may be made. For example, the first lower conductive layer 63a and the second lower conductive layer 63b may also be disposed in the middle of the lower encapsulation film 60.

The upper encapsulation film 50 sealing the display panel 22 may include an organic layer or an inorganic layer, and may further include a combination of an organic layer and an inorganic layer. The organic layer and/or the inorganic layer constituting the upper encapsulation film 50 may be formed of the same material as the organic layer 31 and/or the inorganic layer 32 of FIG. 1. The upper encapsulation film 50 may have the same structure as the encapsulation film 30 of FIG. 1 or the encapsulation film 40 of FIG. 4. Unlike the encapsulation film 30 or 40 of FIG. 1 or 4, however, the upper encapsulation film 50 may not include conductive layers 33 and 43, respectively.

Figure 6:
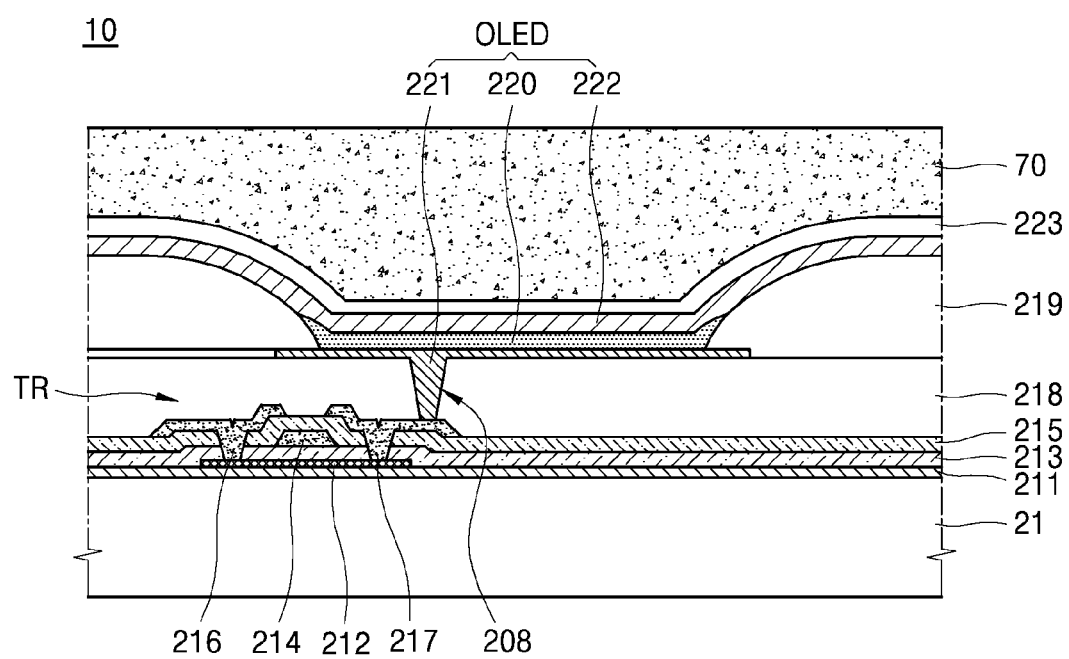
FIG. 6 is a schematic cross-sectional view illustrating an embodiment of a display apparatus that may be included in embodiments of the present invention.

FIG. 6 is a schematic cross-sectional view illustrating an embodiment of a display apparatus 10 that may be included in the embodiments of the present invention.

The display apparatus 10 may include an organic light-emitting device OLED as a display device, and a thin film transistor TR. Accordingly, the display panel 22 may include a plurality of organic light-emitting devices OLED spaced apart from each other, and a thin film transistor TR. The organic light-emitting devices OLED and the thin film transistor TR may be formed on a substrate 21. The substrate 21 may be formed of a glass material, a plastic material, or a metal material.

A buffer layer 211 may be formed on the substrate 21. The buffer layer 211 may provide a flat surface on the substrate 21, and may include an insulating material for preventing moisture or foreign substances from penetrating into the substrate 21.

A thin film transistor TR, a capacitor (not illustrated), and an organic light-emitting device OLED may be formed on the buffer layer 211. The thin film transistor TR may include an active layer 212, a gate electrode 214, a source electrode 216, and a drain electrode 217. The organic light-emitting device OLED may include a first electrode 221, a second electrode 222, and an intermediate layer 220.

The active layer 212 formed in a predetermined pattern may be disposed on the buffer layer 211. The active layer 212 may include an inorganic semiconductor material, such as, silicon, an organic semiconductor material, or a semiconductor oxide material, and may be formed by implantation of a P-type or N-type dopant.

A gate insulating film 213 may be formed on the active layer 212. The gate electrode 214 may be formed on the gate insulating film 213 in an area corresponding to the active layer 212.

An interlayer insulating film 215 may be formed to cover the gate electrode 214. The source electrode 216 and the drain electrode 217 may be formed on the interlayer insulating film 215 to contact a region of the active layer 212. Further, a planarization film 218 may be formed to cover the source electrode 215 and the drain electrode 217. A separate insulating film may be formed on the planarization film 218.

The first electrode 221 may be formed on the planarization film 218. The first electrode 221 may be formed to be electrically connected any one of the source and drain electrodes 216 and 217, respectively, through a through-hole 208.

A pixel definition film 219 may be formed over the first electrode 221. An opening may be formed in the pixel definition film 219, and the intermediate layer 220 including an organic emission layer may be formed in a region defined by the opening. The pixel definition film 219 defines a pixel region and a non-pixel region. That is, the opening of the pixel definition film 219 corresponds to a pixel region.

The second electrode 222 may be formed on the intermediate layer 220. The first electrode 221 may be patterned in each pixel, and the second electrode 222 may be formed to apply a common voltage to all pixels.

The intermediate layer 220 includes an organic emission layer. In another example, the intermediate layer 220 includes an organic emission layer and may further include at least one of a hole injection layer (HIL), a hole transport layer (HTL), an electron transport layer (ETL), and an electron injection layer (EIL). However, the present embodiment is not limited thereto, and the intermediate layer 220 may include an organic emission layer and may further include other various functional layers.

Although only one organic light-emitting device OLED is illustrated in FIG. 6, the display apparatus 10 may include a plurality of organic light-emitting devices OLED. A single pixel may be formed in each organic light-emitting device OLED, and a red color, a green color, a blue color, or a white color may be implemented at each pixel. However, embodiments of the present invention are not limited thereto. For example, the intermediate layer 220 may be commonly formed on the entire planarization film 218, regardless of the position of the pixel. The intermediate layer 220 may have a variety of structures. For example, a structure in which at least a light-emitting substance emitting a red light, a light-emitting substance emitting a green light, and a light-emitting substance emitting a blue light may be stacked on one another. However, in another exemplary embodiment configured to emit white light, the intermediate layer 220 may include a structure in which at least a light-emitting substance emitting a red light, a light-emitting substance emitting a green light, and a light-emitting substance emitting a blue light are mixed.

The red, green, and blue colors are merely exemplary and the present embodiment is not limited thereto. In other words, any combination of other various colors, which is capable of emitting a white light, may be employed in addition to a combination of red, green, and blue colors. In addition, the display apparatus 10 may further include a color filter or a color conversion layer that converts the emitted white light into a predetermined color.

The protection layer 223 may be disposed on the organic light-emitting device OLED and the pixel definition film 219 to cover and protect the organic light-emitting device OLED. The protection layer 223 may include an inorganic insulating film and/or an organic insulating film.

An encapsulation film 70 is formed on the protection layer 223. The encapsulation film 70 may have a similar structure to any one of the encapsulation films 30, 40 and 50 of FIGS. 1 to 5. In addition, although not illustrated, the lower encapsulation film 60 of FIG. 5 may be displayed on the bottom surface of the substrate 21.

As described above, according to the one or more of the above embodiments of the present invention, since at least one pair of conductive layers are provided in the encapsulation film of the display apparatus, characteristics of the encapsulation film may be evaluated. Accordingly, a defect in the encapsulation film may be detected in advance. Also, the reliability of the display apparatus may be improved by analyzing the status of the display apparatus.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A display apparatus, comprising:
   a substrate;
   a display panel disposed on an upper surface of the substrate; and
   an encapsulation film disposed over the substrate and configured to seal the display panel, the encapsulation film comprising:
   a first organic layer fully covering a top and sides of the display panel;
   a first inorganic layer fully covering a top and sides of the first organic layer;
   a second organic layer fully covering a top and sides of the first inorganic layer;
   a first conductive layer fully covering a top and sides of the second organic layer and comprising an end extending therefrom to cover a portion of the substrate;
   a second inorganic layer fully covering a top and sides of the first conductive layer, but not covering the end of the first conductive layer;
   a second conductive layer disposed to cover only an uppermost top portion of the second inorganic layer;

a first additional electrode formed on the end of the first conductive layer; and a second additional electrode formed on a top surface of the second conductive layer.

2. The display apparatus of claim 1, wherein at least one of the first conductive layer and the second conductive layer comprise a transparent conductive oxide.

3. The display apparatus of claim 1, further comprising: a lower encapsulation film disposed on a lower surface of the substrate.

4. The display apparatus of claim 3, wherein the lower encapsulation film comprises:
at least one of a third organic layer and a third inorganic layer; and
at least one pair of conductive layers comprising a third conductive layer and a fourth conductive layer.

5. The display apparatus of claim 1, wherein the display panel further comprises a plurality of organic light-emitting devices (OLEDs) spaced apart from each other.

6. A display apparatus, comprising:
a substrate;
a display panel disposed on a first side of the substrate;
an upper encapsulation film sealing the display panel; and
a lower encapsulation film disposed on a second side of the substrate, the second side of the substrate being opposite to the first side of the substrate,
wherein the upper encapsulation film comprises:
a first organic layer fully covering a top and sides of the display panel;
a first inorganic layer fully covering a top and sides of the first organic layer;
a second organic layer fully covering a top and sides of the first inorganic layer;
a first conductive layer fully covering a top and sides of the second organic layer and comprising an end extending therefrom to cover a portion of the substrate;
a second inorganic layer fully covering a top and sides of the first conductive layer, but not covering the end of the first conductive layer;
a second conductive layer disposed to cover only an uppermost top portion of the second inorganic layer;
a first additional electrode formed on the end of the first conductive layer; and
a second additional electrode formed on a top surface of the second conductive layer;
and
the lower encapsulation film comprises:
at least one of a lower organic layer and a lower inorganic layer, and
at least one pair of lower conductive layers comprising a first lower conductive layer and a second lower conductive layer.

7. The display apparatus of claim 6, wherein the at least one of the lower organic layer and the lower inorganic layer is between the first lower conductive layer and the second lower conductive layer.

8. The display apparatus of claim 6, wherein the first lower conductive layer or the second lower conductive layer is disposed on a first side of the at least one lower inorganic layer and the other of the first lower conductive layer or the second lower conductive layer is disposed on a second side of the at least one lower inorganic layer opposite to the first side.

9. A display apparatus, comprising:
a substrate;
a display panel disposed on an upper surface of the substrate; and
an encapsulation film disposed over the substrate and configured to seal the display panel, the encapsulation film comprising:
a first organic layer fully covering a top and sides of the display panel;
a first conductive layer fully covering a top and sides of the first organic layer and comprising an end extending therefrom to cover a portion of the substrate;
a first inorganic layer fully covering a top and sides of the first conductive layer, but not covering the end of the first conductive layer;
a second conductive layer disposed to cover only a top of the first inorganic layer, leaving sides of the first inorganic layer exposed;
a second organic layer covering a top of the second conductive layer to expose a side portion of the second conductive layer; and
a second inorganic layer covering a top of the second organic layer and exposing expose the side portion of the second conductive layer.

10. The display apparatus of claim 9, wherein at least one of the first conductive layer and the second conductive layer comprise a transparent conductive oxide.

11. The display apparatus of claim 9, wherein the display panel further comprises a plurality of organic light-emitting devices (OLEDs) spaced apart from each other.

* * * * *